(12) United States Patent
Miki

(10) Patent No.: US 10,622,216 B2
(45) Date of Patent: Apr. 14, 2020

(54) METHOD FOR MANUFACTURING SEMICONDUCTOR DEVICE

(71) Applicant: Mitsubishi Electric Corporation, Tokyo (JP)

(72) Inventor: Kohei Miki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/897,181

(22) Filed: Feb. 15, 2018

(65) Prior Publication Data
US 2018/0342400 A1  Nov. 29, 2018

(30) Foreign Application Priority Data

May 29, 2017  (JP) ................. 2017-105435

(51) Int. Cl.
*H01L 21/302* (2006.01)
*H01L 21/28* (2006.01)
(Continued)

(52) U.S. Cl.
CPC .... *H01L 21/30621* (2013.01); *H01L 21/0273* (2013.01); *H01L 21/3081* (2013.01); *H01L 21/3085* (2013.01); *H01L 21/3086* (2013.01); *H01L 21/31058* (2013.01); *H01L 23/3171* (2013.01); *H01L 29/66462* (2013.01); *H01L 29/2003* (2013.01)

(58) Field of Classification Search
CPC . H01L 29/402; H01L 29/0619; H01L 29/872; H01L 29/66212; H01L 29/417; H01L 29/205; H01L 29/2003; H01L 29/862; H01L 29/0692; H01L 29/0661; H01L 29/122; H01L 27/15; H01L 33/20; H01L 33/38; H01L 21/0254; H01L 21/30612; H01L 21/0262; H01L 29/475
See application file for complete search history.

(56) References Cited

U.S. PATENT DOCUMENTS 5,279,669 A *  1/1994  Lee ................. B01J 19/126
118/723 I
2002/0074553 A1*  6/2002  Starikov ............... H01L 31/108
257/77
(Continued)

FOREIGN PATENT DOCUMENTS

JP  2000-252265 A  9/2000
JP  2000-349067 A  12/2000
(Continued)

*Primary Examiner* — Brian Turner
(74) *Attorney, Agent, or Firm* — Studebaker & Brackett PC

(57) ABSTRACT

A method for manufacturing a semiconductor device includes: forming a multilayered epitaxial structure on a substrate; applying a novolac-based resist on the multilayered epitaxial structure and patterning the resist through transfer; tapering a shape of the patterned resist by baking; dry-etching the multilayered epitaxial structure using the tapered resist as a mask; and after the dry etching, removing the resist and forming a coating film on the multilayered epitaxial structure, wherein an etching selection ratio between the resist and the multilayered epitaxial structure in the dry etching is controlled to 0.8 to 1.2 so that an inclination is formed in the multilayered epitaxial structure.

6 Claims, 3 Drawing Sheets

(51) Int. Cl.
*H01L 21/84* (2006.01)
*H01L 21/306* (2006.01)
*H01L 23/31* (2006.01)
*H01L 21/3105* (2006.01)
*H01L 21/308* (2006.01)
*H01L 29/66* (2006.01)
*H01L 21/027* (2006.01)
*H01L 29/20* (2006.01)

(56) References Cited

U.S. PATENT DOCUMENTS

| | | | | |
|---|---|---|---|---|
| 2003/0030144 | A1* | 2/2003 | Ono | C23F 4/00 257/748 |
| 2005/0056934 | A1* | 3/2005 | Suzawa | C23F 4/00 257/741 |
| 2009/0087583 | A1* | 4/2009 | Sakuma | C23C 14/046 427/569 |
| 2010/0159705 | A1* | 6/2010 | Qiu | H01J 37/32082 438/710 |
| 2015/0170901 | A1* | 6/2015 | Motayed | H01L 21/0259 438/478 |
| 2015/0349208 | A1* | 12/2015 | Kim | H01L 33/46 257/98 |
| 2017/0263743 | A1* | 9/2017 | Nakata | H01L 21/0254 |
| 2017/0363893 | A1* | 12/2017 | Matsukizono | G02F 1/1368 |
| 2018/0097123 | A1* | 4/2018 | Kajitani | H01L 29/402 |

FOREIGN PATENT DOCUMENTS

| | | |
|---|---|---|
| JP | 2011-119383 A | 6/2011 |
| JP | 5292443 B2 | 9/2013 |

* cited by examiner

METHOD FOR MANUFACTURING SEMICONDUCTOR DEVICE

BACKGROUND OF THE INVENTION

Field

The present invention relates to a method for manufacturing a GaN semiconductor device used for high speed, high frequency communication.

Background

When a multilayered epitaxial structure made of $Al_xGa_{1-x}N$ ($0 \leq x \leq 1$) is dry-etched, a Cl-based gas, particularly $Cl_2/N_2$, $SiCl_4/Ar$ or $BCl_3/Cl_2$ or the like is used. When these gases are used, etching is generally performed vertically, if a metallic or insulating film is formed across this vertical stepped part, disconnections are more likely to occur. This results in problems like deterioration of insulation reliability and increase of the device resistance. To solve these problems, a method for manufacturing an optical element is proposed which forms an inclination in a multilayered epitaxial structure and prevents disconnections using a complicated method (e.g., see JP 5292443 B2).

SUMMARY

Since etching is performed vertically under a simple condition, an inclination is formed according to conventional methods by changing various conditions. However, an inclination angle is made clear only after etching is performed. Therefore, even when problems are revealed after a process, it is impossible to re-do the process and the product cannot be used, and the product has to be disposed of. Therefore, by increasing the number of steps, the stepped part is limited to such a level that would cause no disconnection even if etching is done vertically. Alternatively, the method is changed from a vapor deposition method or the like which is a method for forming an anisotropic metal that could promote disconnections to a method for forming an isotropic metal such as sputtering. As a result, there is a problem that the yield becomes lower, the number of steps increases and the degree of freedom in processes deteriorates.

The present invention has been implemented to solve the above-described problems and it is an object of the present invention to provide a method for manufacturing a semiconductor device capable of improving yield while preventing an increase in the number of steps and deterioration of the degree of freedom in processes.

A method for manufacturing a semiconductor device according to the present invention includes: forming a multilayered epitaxial structure on a substrate; applying a novolac-based resist on the multilayered epitaxial structure and patterning the resist through transfer; tapering a shape of the patterned resist by baking; dry-etching the multilayered epitaxial structure using the tapered resist as a mask; and after the dry etching, removing the resist and forming a coating film on the multilayered epitaxial structure, wherein an etching selection ratio between the resist and the multilayered epitaxial structure in the dry etching is controlled to 0.8 to 1.2 so that an inclination is funned in the multilayered epitaxial structure.

According to the present invention, the resist is tapered, the etching selection ratio between the resist and the multilayered epitaxial structure in the dry etching is controlled to 0.8 to 1.2 and an inclination is formed in the multilayered epitaxial structure. Therefore, the yield can be improved while preventing an increase in the number of steps and a decrease in the degree of freedom in processes.

Other and further objects, features and advantages of the invention will appear more fully from the following description.

DESCRIPTION OF EMBODIMENTS

Figure 1:
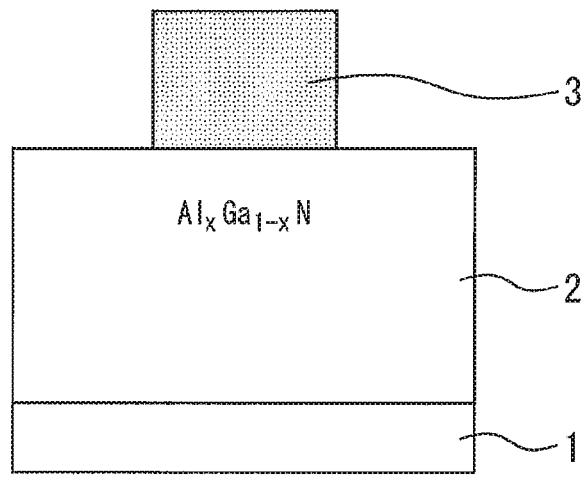
FIGS. 1 to 4 are cross-sectional views illustrating a method for manufacturing a semiconductor device according to an embodiment of the present invention.

FIGS. 1 to 4 are cross-sectional views illustrating a method for manufacturing a semiconductor device according to an embodiment of the present invention. First, as shown in FIG. 1, a multilayered epitaxial structure 2 is formed on a substrate 1. The multilayered epitaxial structure 2 is, for example, a GaN-HEMT structure. A resist 3 is applied to the multilayered epitaxial structure 2 and patterned through transfer. The resist 3 is a novolac-based resist which has a characteristic of being thermally deformed, and is, for example, PF158A9 or SPR510A.

Figure 2:
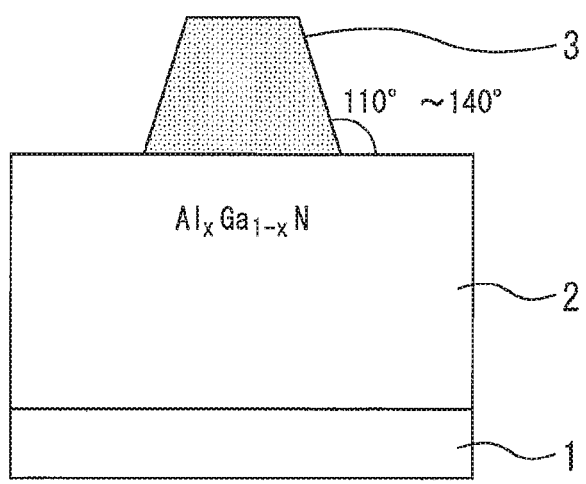

Next, as shown in FIG. 2, the shape of the patterned resist 3 is tapered by baking. Baking is a thermal flow using heat. The inclination angle of the tapered resist 3 has a certain degree of freedom depending on the heat, but the angle is preferably about 110° to 140° in consideration of stability of the material or the like. More specifically, the resist 3 is heated with a hot plate for about 3 minutes at about 140 to 160° C. in the case of PF158A9 and at about 130 to 160° C. in the case of SPR510A. The resist 3 may be made of an inorganic material such as photosensitive polyimide or SOG (spin-on glass) if it is a thermally deformable material.

Figure 3:
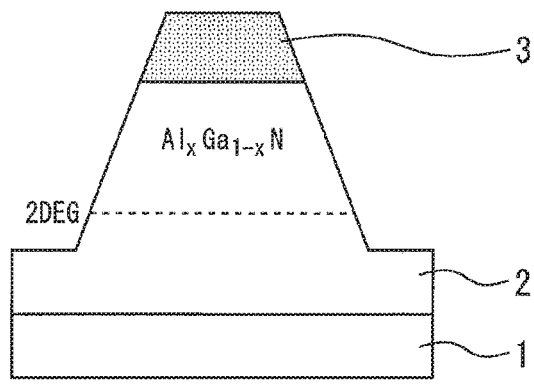

Next, as shown in FIG. 3, the multilayered epitaxial structure 2 is dry-etched using the tapered resist 3 as a mask. In this dry etching, using an ICP-RIE apparatus, it is assumed that a $Cl_2/N_2$ mixing ratio of a $Cl_2/N_2$ gas is 0.2 to 0.5, a processing pressure is 0.6 Pa to 1.0 Pa, an antenna space power density is 0.38 to 0.5 $kW/m^3$ and a bias power density is 6.3 to 19 $kW/m^2$. Thus, an etching selection ratio between the resist 3 and the multilayered epitaxial structure 2 becomes about 1. Therefore, the inclination of the resist 3 is transferred to the multilayered epitaxial structure 2 as is, making it possible to form an inclination in the multilayered epitaxial structure 2.

If the etching selection ratio is 1, the inclination angle of the multilayered epitaxial structure 2 becomes equivalent to the inclination angle of the resist 3. However, the etching selection ratio is not limited to 1, but by controlling the etching selection ratio to 0.8 to 1.2, it is possible to form an inclination in the multilayered epitaxial structure 2 although it is slightly different from the inclination angle of the resist 3. Note that a CCP-RIE apparatus may be used instead of the ICP-RIE apparatus.

Even in the case where the processing pressure, the antenna space power density and the bias power density cannot be set to the above-described values due to constraints of the apparatus, correction coefficients are confirmed from the etching selection ratio obtained and the inclination angle of the resist 3 is adjusted. The inclination angle of the multilayered epitaxial structure 2 can be adjusted in this way.

Figure 4:
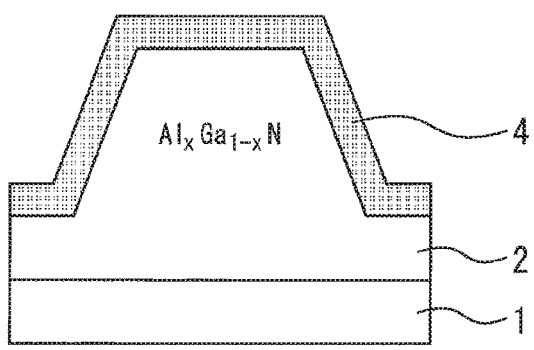

Next, as shown in FIG. 4, the resist 3 is removed and a coating film 4 is formed on the multilayered epitaxial structure 2. The coating film 4 is a metal such as Au, Ti, Pt, Nb, Mo or an insulating film such as SiN, SiO, IiW or AlO. The thickness of the coating film 4 is not limited. Experimentally, no disconnection is generated in the coating film 4 if the inclination angle of the multilayered epitaxial structure 2 falls within a range of 110° to 140°.

Figure 5:
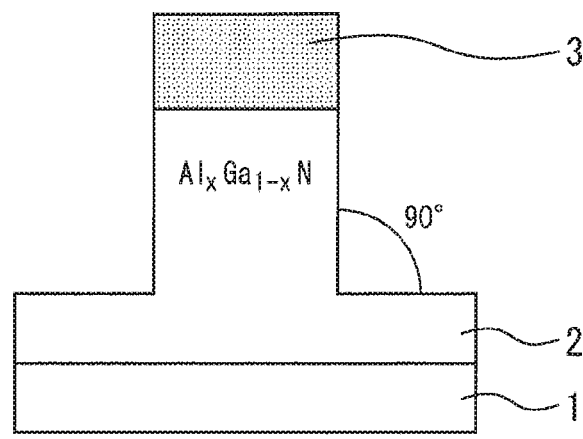
FIG. 5 and FIG. 6 are cross-sectional views illustrating a method for manufacturing a semiconductor device according to the comparative example.
Figure 6:
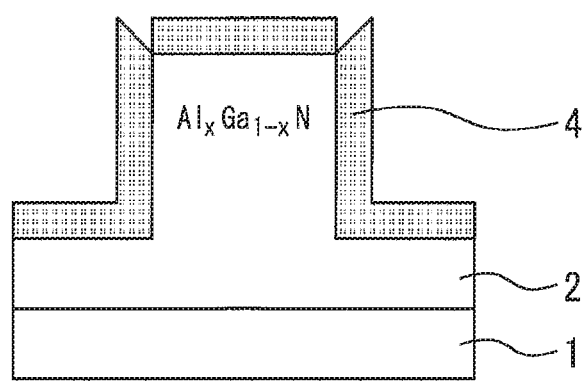

Next, effects of the present embodiment will be described in comparison with a comparative example. FIG. 5 and FIG. 6 are cross-sectional views illustrating a method for manufacturing a semiconductor device according to the comparative example. In the comparative example, since the resist 3 is not tapered, the multilayered epitaxial structure 2 is vertically etched as shown in FIG. 5. Therefore, as shown in FIG. 6, disconnections of coating film 4 are produced at edges.

In contrast, according to the present embodiment, the resist 3 is tapered, the etching selection ratio between the resist 3 and the multilayered epitaxial structure 2 in the dry etching is controlled to 0.8 to 1.2 so that an inclination is formed in the multilayered epitaxial structure 2. Thus, it is possible to prevent disconnections in the coating film 4 using a simple method. Moreover, no constraints are placed on any step other than the dry etching step.

Furthermore, it is possible to easily predict the inclination angle of the processed multilayered epitaxial structure 2 based on the inclination angle of the resist 3. Thus, by measuring the inclination angle of the resist 3 in advance, it is possible to adjust the inclination angle of the multilayered epitaxial structure 2 to a desired value by only redoing application of the resist 3 and baking. As a result, the yield can be improved while preventing an increase in the number of steps and a decrease in the degree of freedom in processes.

The depth of dry etching is optional. However, when there are no constraints of productivity or the apparatus, the depth of dry etching is preferably greater than the depth of the 2DEG part which is an operation layer of a GaN-HEMT structure. This makes it possible to provide disconnection prevention and isolation effects simultaneously.

Note that the coating film 4 is not limited to one remaining as a structure such as a metal or insulating film, but may be a resist mask. In this case, it is possible to prevent the applied resist from being disconnected at vertical shaped edges and thereby prevent unexpected etching.

Obviously many modifications and variations of the present invention are possible in the light of the above teachings. It is therefore to be understood that within the scope of the appended claims the invention may be practiced otherwise than as specifically described.

The entire disclosure of Japanese Patent Application. No. 2017-105435, filed on May 29, 2017 including specification, claims, drawings and summary, on which the Convention priority of the present application is based, is incorporated herein by reference in its entirety.

The invention claimed is:

1. A method for manufacturing a semiconductor device comprising:
   forming a multilayered epitaxial structure on a substrate;
   applying a novolac-based resist on the multilayered epitaxial structure and patterning the resist through transfer;
   tapering a shape of the patterned resist along a sidewall of the resist in cross section by baking;
   dry etching the multilayered epitaxial structure using the tapered resist as a mask; and
   after the dry etching, removing the resist and forming a coating film on the multilayered epitaxial structure, wherein
   the multilayered epitaxial structure is made of $Al_xGa_{1-x}N$ ($0 \le x \le 1$),
   a $Cl_2/N_2$ gas is used in the dry etching,
   an etching selection ratio between the resist and the multilayered epitaxial structure in the dry etching is controlled to 0.8 to 1.2 so that an inclination is formed in the multilayered epitaxial structure,
   a $Cl_2/N_2$ mixing ratio of the $Cl_2/N_2$ gas is 0.2 to 0.5, and
   an antenna space power density is 0.38 to 0.5 $kW/m^3$ and a bias power density is 6.3 to 19 $kW/m^2$ in the dry etching.

2. The method for manufacturing a semiconductor device according to claim 1, wherein the multilayered epitaxial structure is a GaN-HEMT structure, and
   a depth of the dry etching is greater than a depth of the 2DEG part which is an operation layer of the GaN-HEMT structure.

3. The method for manufacturing a semiconductor device according to claim 1, wherein a processing pressure is 0.6 Pa to 1.0 Pa in the dry etching.

4. The method for manufacturing a semiconductor device according to claim 3, wherein an ICP-RIE apparatus is used in the dry etching.

5. The method for manufacturing a semiconductor device according to claim 4, wherein the multilayered epitaxial structure is a GaN-HEMT structure, and
   a depth of the dry etching is greater than a depth of the 2DEG part which is an operation layer of the GaN-HEMT structure.

6. The method for manufacturing a semiconductor device according to claim 3, wherein the multilayered epitaxial structure is a GaN-HEMT structure, and
   a depth of the dry etching is greater than a depth of the 2DEG part which is an operation layer of the GaN-HEMT structure.

* * * * *